(12) United States Patent
Hope et al.

(10) Patent No.: US 7,145,353 B2
(45) Date of Patent: Dec. 5, 2006

(54) DOUBLE SIDE PROBING OF SEMICONDUCTOR DEVICES

(75) Inventors: Jeremy Hope, Hitchin (GB); Adrian R. Overall, Huntingdon (GB); John J. Fitzpatrick, Milton Keynes (GB)

(73) Assignee: Wentworth Laboratories, Inc., Brookfield, CT (US)

( * ) Notice: Subject to any disclaimer, the term of this patent is extended or adjusted under 35 U.S.C. 154(b) by 0 days.

(21) Appl. No.: 11/095,808

(22) Filed: Mar. 30, 2005

(65) Prior Publication Data

US 2005/0225339 A1  Oct. 13, 2005

Related U.S. Application Data

(60) Provisional application No. 60/558,647, filed on Apr. 1, 2004.

(51) Int. Cl.
*G01R 1/067* (2006.01)
*G01R 31/26* (2006.01)

(52) U.S. Cl. .................. 324/754; 324/752; 324/767

(58) Field of Classification Search ................ None
See application file for complete search history.

(56) References Cited

U.S. PATENT DOCUMENTS

| | | | | |
|---|---|---|---|---|
| 5,412,314 A | * | 5/1995 | Fukunaga et al. | ....... 324/158.1 |
| 5,467,020 A | * | 11/1995 | Boyette et al. | ............. 324/537 |
| 6,384,612 B1 | * | 5/2002 | Freund et al. | ............. 324/750 |
| 6,404,181 B1 | * | 6/2002 | Hikita | ..................... 324/158.1 |

\* cited by examiner

*Primary Examiner*—Ernest Karlsen
(74) *Attorney, Agent, or Firm*—Wiggin and Dana LLP; Anthony P. Gangemi; Gregory S. Rosenblatt

(57) ABSTRACT

A probe head for testing the properties of a semiconducting device (10) under test including a dielectric film (24) supporting at least one semiconducting device (10) under test with a support frame (26) tautly supporting the dielectric film (24). A first support (40) positions a first probe (28) for electrically contacting a first side (16) of the semiconducting device (10) under test and a second support (34), having a actuator to move a second probe (30) between a first position (P1) and a second position (P2), positions second probe (30) with the second position (P2) being for electrically contacting an opposing second side (18) of the semiconductor device under test.

7 Claims, 6 Drawing Sheets

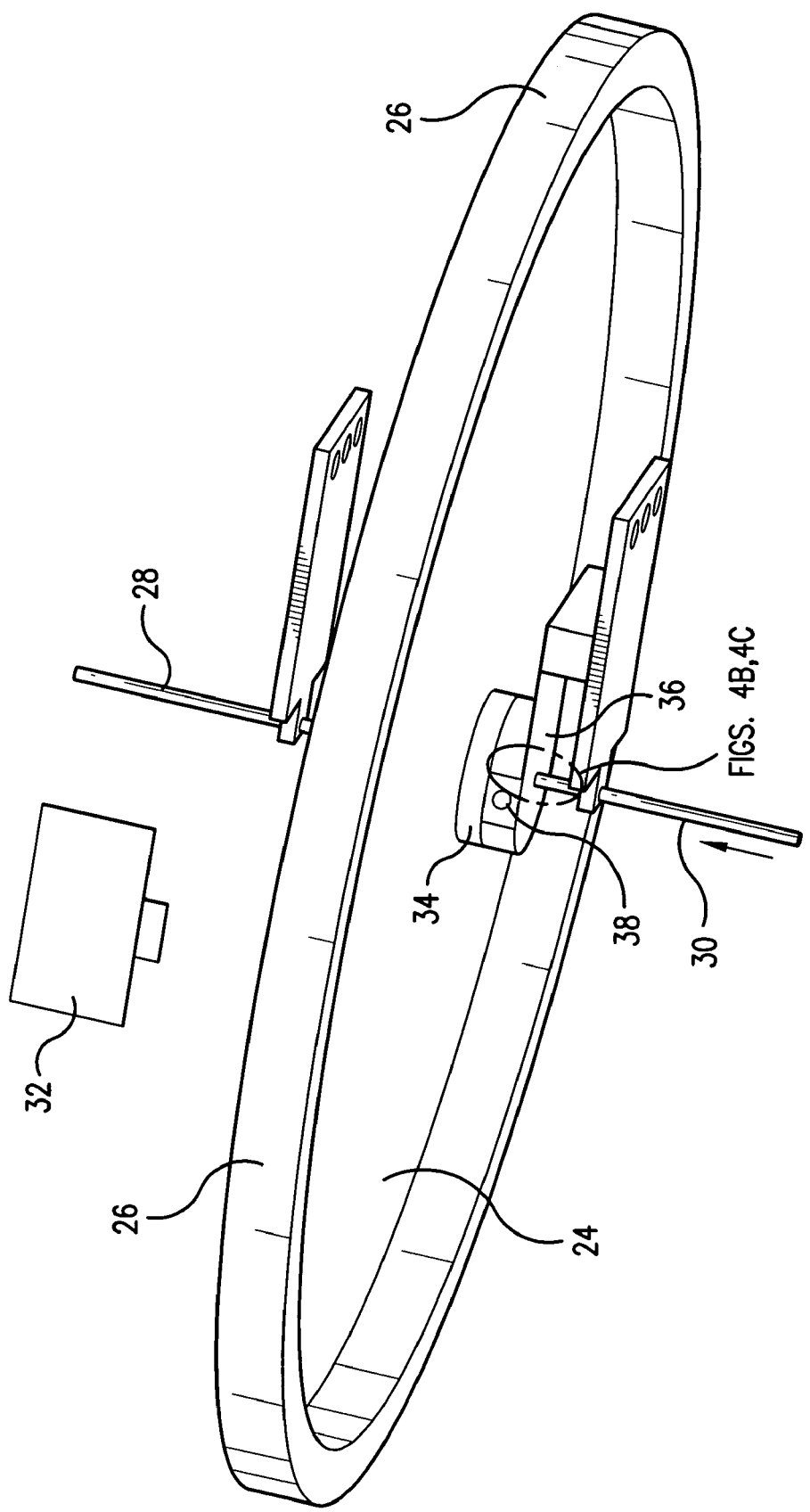

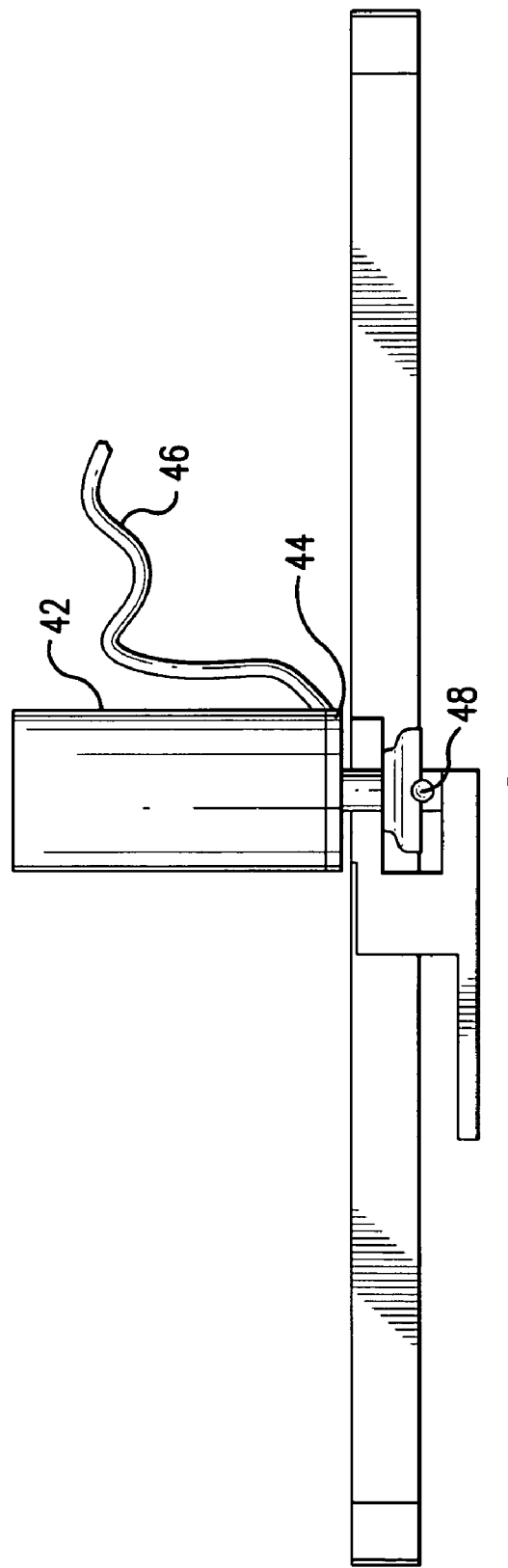

DOUBLE SIDE PROBING OF SEMICONDUCTOR DEVICES

CROSS-REFERENCE TO RELATED APPLICATION

This patent application claims benefit under 35 U.S.C. § 119 (e) of copending, U.S. Provisional Patent Application Ser. No. 60/558,647, filed Apr. 1, 2004, the disclosure of which is incorporated by reference herein in its entirety.

BACKGROUND OF THE INVENTION

1. Field of the Invention

This invention relates to a probe head for testing the electrical properties of a semiconducting device under test. More particularly, the probe head contacts both sides of the semiconducting device under test and can receive electrical and optical inputs. The probe head is particularly effective for testing the characteristics of a light emitting diode (LED).

2. Description of the Related Art

An LED is a semiconductor device that emits incoherent monochromatic light when electrically biased in a forward direction. The effect is a form of electroluminescence with the color and wavelength dependent on the semiconducting material used. For example, aluminum gallium arsenide generates red and infrared light, gallium nitride generates green light, and zinc selenide generates blue light.

FIG. 1 illustrates an LED 10 (also referred to as semiconducting device 10 or device 10) as known from the prior art. The LED 10 includes first 12 and second 14 electrically conductive contact pads located on opposing first 16 and second 18 sides of the LED. When a direct current voltage is impressed across the first 12 and second 14 contact pads and biased in the proper direction, the LED 10 emits light 20.

With reference to FIG. 2, the electrically conductive contact pads and other features of the LED 10 are typically formed by doping a wafer 22. It is necessary to test the electrical and optical characteristics of the LED. Such testing is conventionally done at the wafer 22 stage prior to singulation of the LEDs 10.

Interference from adjoining LEDs may influence the electrical and optical data acquired during wafer stage test. More accurate measurement of LED characteristics may be obtained if testing is performed following singulation.

BRIEF SUMMARY OF THE INVENTION

One aspect of the present invention is a probe head component for testing the properties of a semiconducting device under test, which includes a dielectric film supporting at least one semiconducting device under test, a support frame tautly supporting the dielectric film, a first probe for contacting a first side of the semiconducting device under test, and a second probe moveable between a first position and a second position wherein the second position is for contacting an opposing second side of the semiconductor device under test.

Another aspect of the present invention is a probe head for testing the properties of a semiconducting device under test, which includes a dielectric film supporting at least one semiconducting device under test, a support frame tautly supporting the dielectric film, a first support positioning a first probe for electrically contacting a first side of the semiconducting device under test, and a second support having a actuator to move a second probe between a first position and a second position wherein the second position is for electrically contacting an opposing second side of the semiconductor device under test.

The details of one or more embodiments of the invention are set forth in the accompanying drawings and the description below. Other features, objects and advantages of the invention will be apparent from the description and drawings, and from the claims.

BRIEF DESCRIPTION OF THE DRAWINGS

For the purpose of illustrating the invention, the drawings show a form of the invention that is presently preferred. However, it should be understood that the present invention is not limited to the precise arrangements and instrumentalities shown in the drawings, wherein:

FIG. 4A is a perspective view of a probe head having top and bottom probes for electrical contact to opposing sides of a light emitting diode under test;

FIG. 7 is a cross-sectional view of a method for transmitting electrical and optical signals between the probe head and external circuitry.

DETAILED DESCRIPTION

Figure 1:
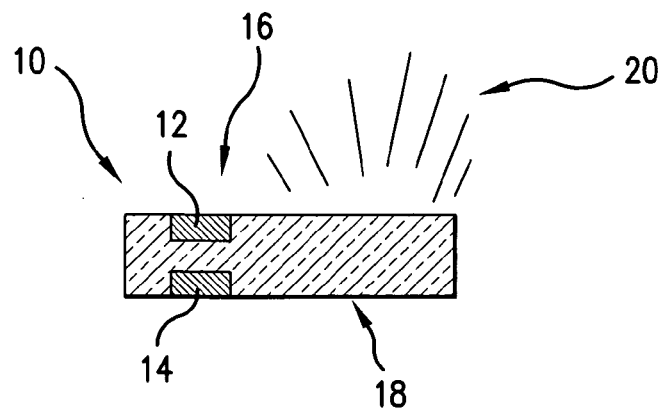
FIG. 1 is a cross-sectional view of a light emitting diode as known from the prior art.
Figure 2:
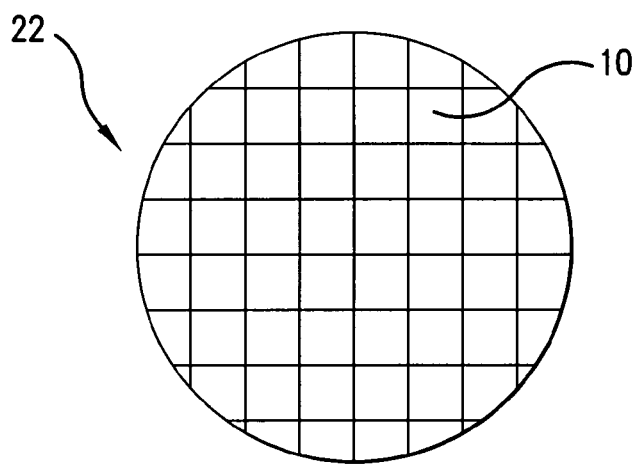
FIG. 2 is a plan view of a wafer containing a plurality of light emitting diodes.
Figure 3:
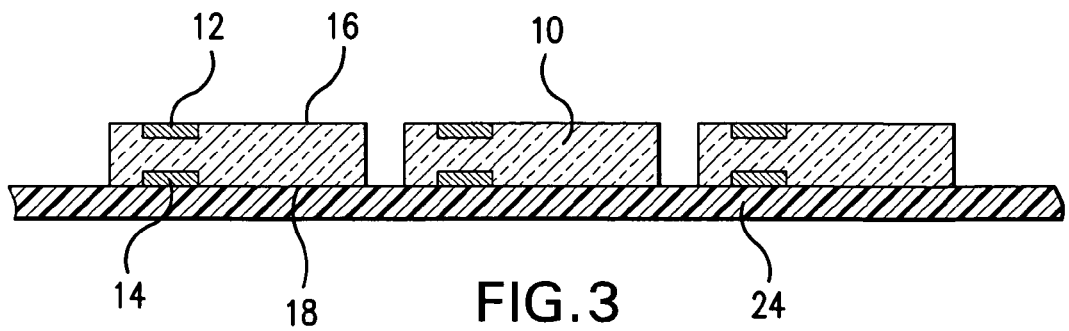
FIG. 3 is a cross-sectional view of a plurality of singulated light emitting diodes supported by a dielectric film.

Referring now to the drawings in which like reference numerals indicate like parts, and in particular, to FIGS. 3 and 4A, one aspect of the present invention is a probe head for collecting data from both sides of one or more semiconducting devices 10. Devices 10 are supported by a dielectric film 24, such as 70-micron thick polymer film, which is tautly supported by a support frame 26. In one embodiment, devices 10 are singulated LEDs that are separated from one another and held on dielectric film 24. While under test, devices 10 are analyzed using a first probe 28 to analyze first side 16 and a second probe 30 to analyze second side 18. Using this method, the position of devices 10 relative to first probe 28 and second probe 30 is not predicable as with conventional solid wafer probing a solid wafer.

Dielectric film 24 is scanned using a camera 32, for example, a line scanning camera, with software that will capture the position of the devices enabling a wafer map to be built. Alternatively, camera 32 is offset by a known distance from first probe 28. The device under test is passed through camera 32's field of view before being tested. Using software, the exact position of the device under test within camera 32's field of view is determined. This data is then used to drive a probe controller the exact amount of distance along the X and Y-axes to bring the device under probes 28 and 30. This scanning camera can be part of the probing equipment or can be equipment specifically for scanning the film frames. The data obtained by the camera can be transferred to other probing equipment by means of network protocol, typically internet protocol (IP).

Figure 4B:
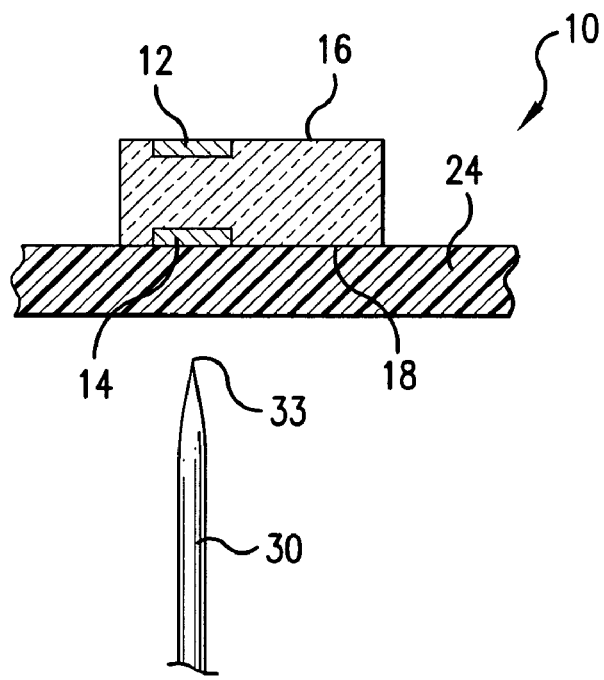
FIG. 4B is an enlarged partial cross-sectional view of the probe head illustrated in FIG. 4A in a first position.
Figure 4C:
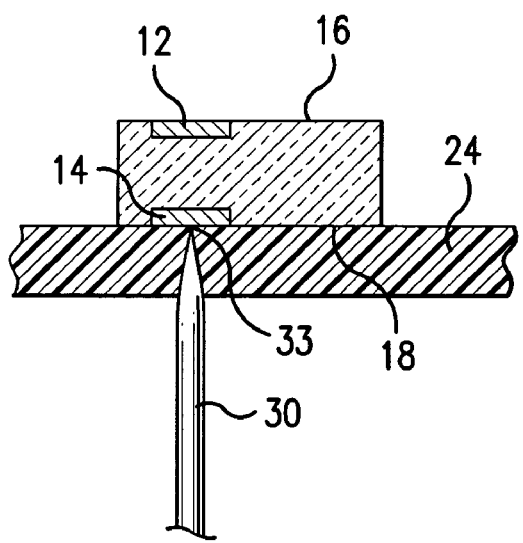
FIG. 4C is an enlarged partial cross-sectional view of the probe head illustrated in FIG. 4A in a second position.
Figure 5:
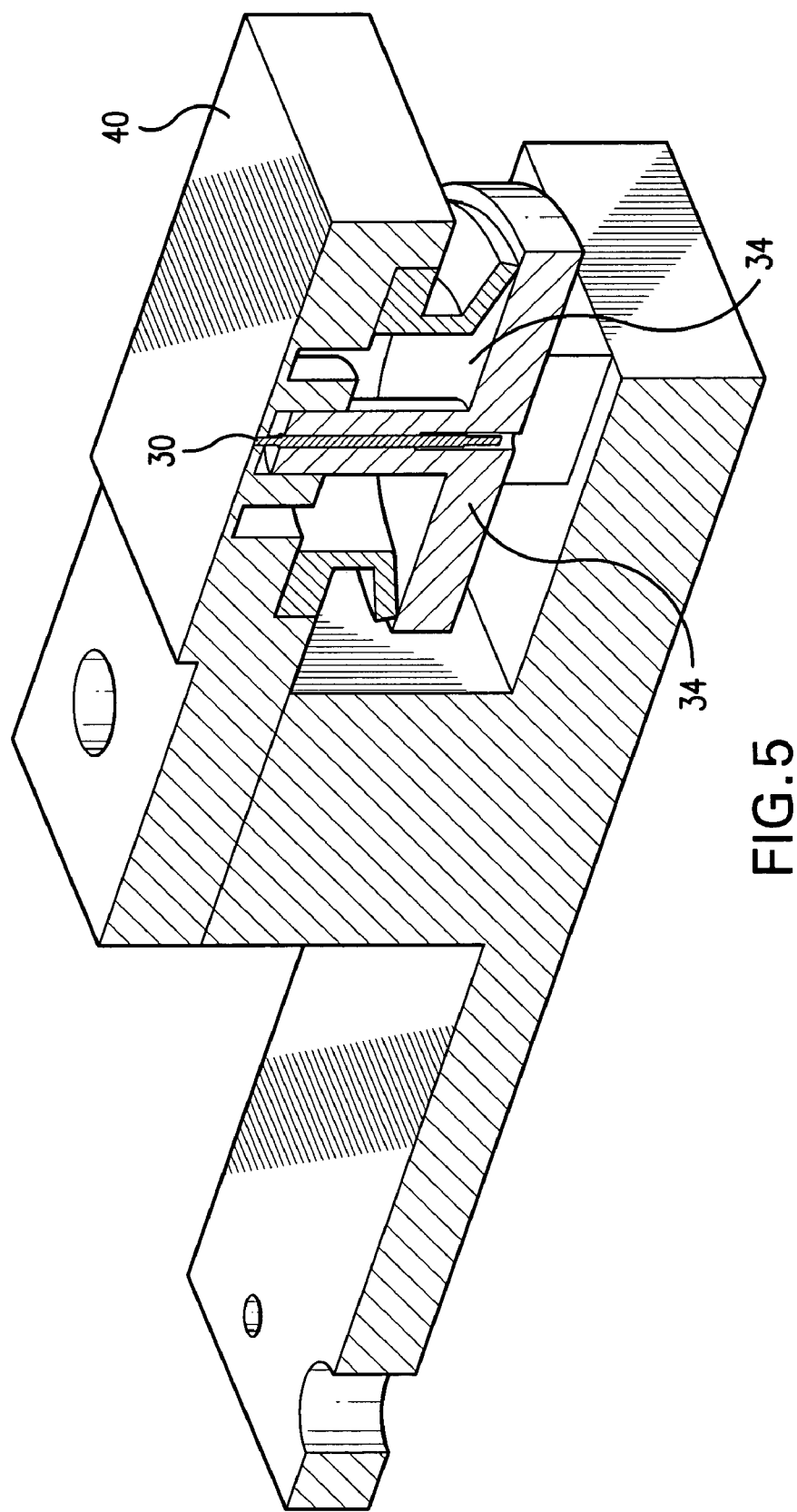
FIG. 5 is a perspective view of a bottom portion of a probe head fixture.
Figure 6:
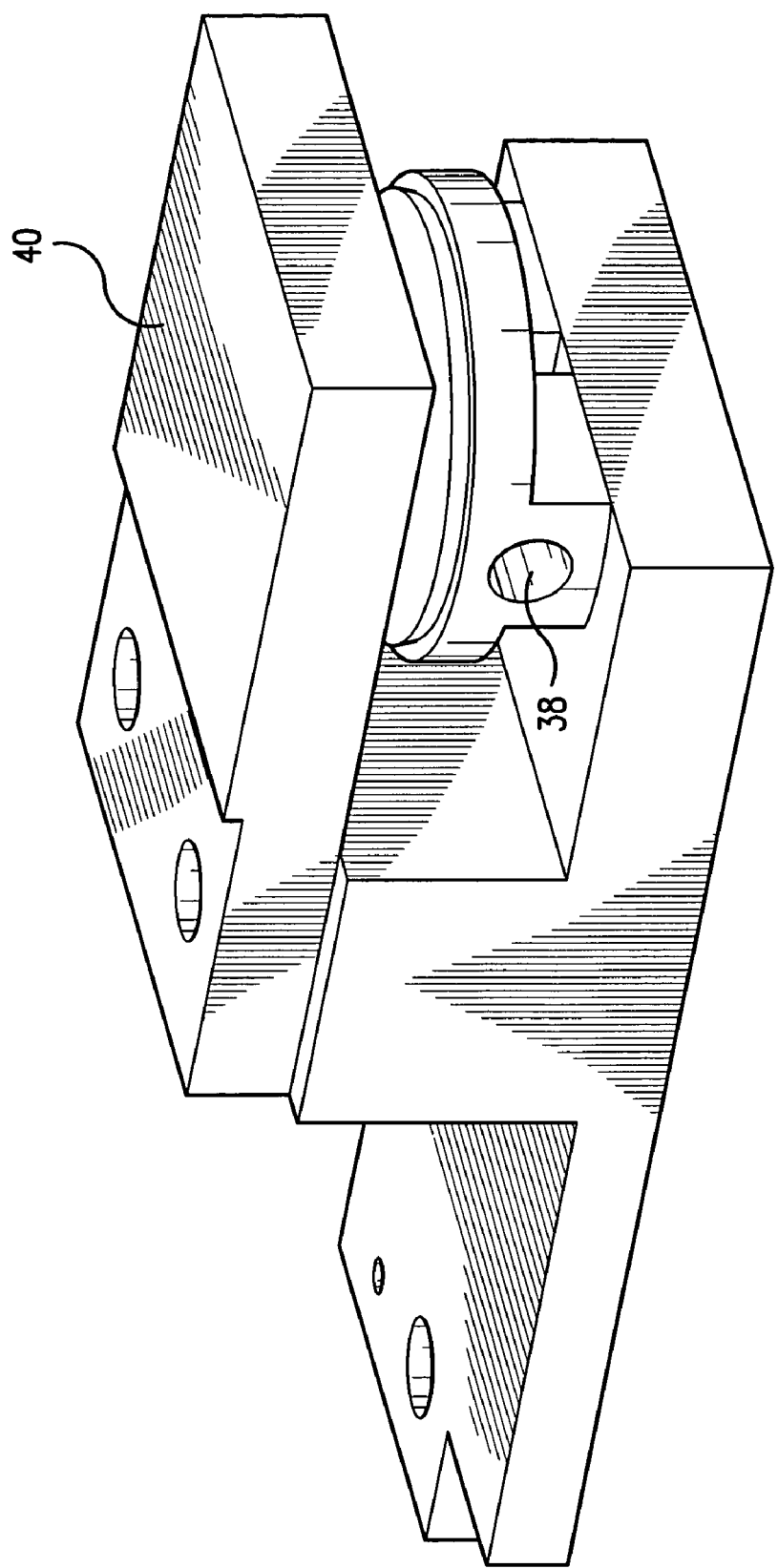
FIG. 6 is a perspective view of a probe head fixture.

When the device is at the proper position, first probe 28 electrically contacts first electrically conductive pad 12. Second probe 30 is moveable between a first position P1, that is remote from device 10, and a second position P2 that makes electrical contact with second electrically conductive contact pad 14. As second probe 30 moves from first position P1 to second position P2, as indicated by the arrow in FIG. 4A, dielectric film 24 is pierced enabling the second probe to make electrical contact, as illustrated in FIGS. 4B and 4C.

Second probe 30 is typically formed from an electrically conductive material, such as a copper alloy and may be of the type known in the industry as a pogo contact. Second probe 30 is in the form of a rod having a diameter of about 0.2 millimeter. Second probe 30 terminates at a probe tip 33 that is effective to pierce dielectric film 24 and to electrically contact device 10 under test. For example, probe tip 33 may have a reduced diameter point.

With reference to FIGS. 4A through 6, second probe 30 is supported by a second support 34 that includes an actuator (not shown). Second support 34 may include a hermetic housing (not shown) supported against dielectric film 24, such as by a stainless steel shim 36 that provides a spring pressure and an actuator (not shown) to move second probe between the first position and the second position. A preferred actuator is a vacuum. An inlet 38 enables a vacuum to be drawn within second support 34. When a vacuum is drawn, second probe 30 moves to second position P2. The vacuum is also effective to hold dielectric film 24 and device 10 under test in a stable position. A first support 40 positions first probe 28 and mechanically holds it stable while making electrical contact with first side 16 of semiconducting device 10 under test. First probe 28 may be an electrically conductive rod, of the type described above for second probe 30.

When device 10 under test is an LED, in addition to electrical properties, it is desirable to evaluate the optic properties of the device. Now referring to FIG. 7, in one embodiment, a light tube 42 may be utilized. Light tube 42 terminates at a transparent surface 44 that is coated with an electrically conductive, optically transparent, coating (not shown). Transparent surface 44 may be a glass plate that is transparent to the light emitted by the LED.

The glass plate is typically coated with an electrically conductive layer that is also transparent to the light emitted by the LED, such as indium tin oxide.

A first cable 46 transmits optical and electrical information to a piece of test equipment, such as a computer and a second cable 48 transmits electrical information to the test equipment.

One or more embodiments of the present invention have been described. Nevertheless, it will be understood that various modifications may be made without departing from the spirit and scope of the invention. For example, devices other than LEDs may be tested using the probe head of the invention. Accordingly, other embodiments are within the scope of the following claims.

What is claimed is:

1. A probe head component for testing the properties of a semiconducting device under test, comprising:
    a dielectric film supporting at least one semiconducting device under test;
    a support frame tautly supporting said dielectric film;
    a first probe for contacting a first side of said semiconducting device under test, said first probe including an optically transparent surface, at least a portion of said optically transparent surface having an electrically conductive, optically transparent coating, said optically transparent surface being in contact with said semiconductor device under test, wherein said first probe is capable of receiving both electrical and optical signals from said semiconducting device under test; and
    a second probe moveable between a first position and a second position wherein said second position is for contacting an opposing second side of said semiconductor device under test.

2. A probe head for testing the properties of a semiconducting device under test, comprising:
    a dielectric film supporting at least one semiconducting device under test;
    a support frame tautly supporting said dielectric film;
    a first support positioning a first probe for electrically contacting a first side of said semiconducting device under test, said first probe including an optically transparent surface, at least a portion of said optically transparent surface having an electrically conductive, optically transparent coating, said optically transparent surface being in contact with said semiconductor device under test, wherein said first probe is capable of receiving both electrical and optical signals from said semiconducting device under test; and
    a second support having a actuator to move a second probe between a first position and a second position wherein said second position is for electrically contacting an opposing second side of said semiconductor device under test.

3. The probe head of claim 2 wherein said electrically conductive, optically transparent coating is indium tin oxide.

4. The probe head of claim 3 wherein said semiconducting device under test is a light emitting diode.

5. The probe head of claim 2 wherein said second probe has a probe tip effective to pierce said dielectric film and electrically contact said semiconducting device under test.

6. The probe head of claim 5 wherein said actuator is a vacuum source.

7. The probe head of claim 5 wherein said second probe is a copper-base alloy rod that terminates at a reduced diameter probe tip.

* * * * *